(12) United States Patent
Toyama et al.

(10) Patent No.: US 10,952,311 B2
(45) Date of Patent: Mar. 16, 2021

(54) ELECTRONIC CONTROL DEVICE, VEHICLE, AND METHOD FOR MANUFACTURING ELECTRONIC CONTROL DEVICE

(71) Applicant: HITACHI AUTOMOTIVE SYSTEMS, LTD., Ibaraki (JP)

(72) Inventors: Masahiro Toyama, Tokyo (JP); Yutaka Uematsu, Tokyo (JP); Hiroki Funato, Tokyo (JP); Hideki Osaka, Tokyo (JP); Mitsuhiro Masuda, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 18 days.

(21) Appl. No.: 16/310,297

(22) PCT Filed: Apr. 24, 2017

(86) PCT No.: PCT/JP2017/016202
§ 371 (c)(1),
(2) Date: Dec. 14, 2018

(87) PCT Pub. No.: WO2017/217118
PCT Pub. Date: Dec. 21, 2017

(65) Prior Publication Data
US 2019/0342989 A1    Nov. 7, 2019

(30) Foreign Application Priority Data
Jun. 17, 2016    (JP) .............................. JP2016-120936

(51) Int. Cl.
*H05K 1/02* (2006.01)
*B60R 16/02* (2006.01)
*H05K 1/18* (2006.01)

(52) U.S. Cl.
CPC ........... *H05K 1/0216* (2013.01); *B60R 16/02* (2013.01); *H05K 1/181* (2013.01); *H05K 2201/10022* (2013.01); *H05K 2201/10053* (2013.01)

(58) Field of Classification Search
CPC ... H05K 1/02; H05K 1/11; H05K 1/18; H05K 1/111; H05K 1/0216; H05K 1/0215;
(Continued)

(56) References Cited

U.S. PATENT DOCUMENTS 5,641,210 A * 6/1997 Moon ..................... B60T 8/364
                                                              303/119.1
9,697,723 B1 * 7/2017 Ladanyi ................... G08B 7/06
(Continued)

FOREIGN PATENT DOCUMENTS

| JP | 2006-332683 A | 12/2006 |
| JP | 2010-073792 A | 4/2010 |
| WO | 2009-096203 A1 | 8/2009 |

OTHER PUBLICATIONS

International Search Report for WO 2017/217118 A1, dated Jul. 4, 2017.

*Primary Examiner* — Rexford N Barnie
*Assistant Examiner* — Jagdeep S Dhillon
(74) *Attorney, Agent, or Firm* — Volpe Koenig

(57) ABSTRACT

Provided is an electronic control unit, which includes a printed wiring board on which a semiconductor element is mounted, including a power supply pattern and a ground pattern which are formed on the printed wiring board and connected to the semiconductor element, at least one capacitance adjustment pattern which is formed on the printed wiring board, and a connection portion which is provided for each capacitance adjustment pattern and able to switch electrical connection between either the power supply pat-
(Continued)

tern or the ground pattern and the capacitance adjustment pattern.

8 Claims, 17 Drawing Sheets

(58) Field of Classification Search
CPC ........ H05K 1/0298; H01L 23/13; H01Q 1/50; H04B 1/38; H04B 1/3827
USPC ............. 307/9.1, 10.1, 66, 64, 80, 109, 108; 455/77, 79; 343/750, 710
See application file for complete search history.

(56) References Cited

U.S. PATENT DOCUMENTS

| | | | |
|---|---|---|---|
| 2003/0063427 A1 | 4/2003 | Kunihiro | |
| 2004/0169294 A1* | 9/2004 | Kanayama | H02M 3/157 323/271 |
| 2009/0129039 A1* | 5/2009 | Kariya | H05K 7/00 361/782 |
| 2009/0160424 A1* | 6/2009 | Yamamoto | H05K 1/18 323/355 |
| 2009/0290316 A1* | 11/2009 | Kariya | H01L 23/50 361/767 |
| 2010/0283124 A1 | 11/2010 | Ohmae et al. | |
| 2013/0237162 A1* | 9/2013 | Yoon | H01Q 1/243 455/77 |
| 2016/0133532 A1* | 5/2016 | Nishino | H05K 1/111 361/782 |
| 2016/0349755 A1* | 12/2016 | Kuwahara | B60W 10/184 |
| 2018/0088387 A1* | 3/2018 | Enami | H05K 1/118 |
| 2019/0029107 A1* | 1/2019 | Nagashima | G06F 1/20 |

* cited by examiner

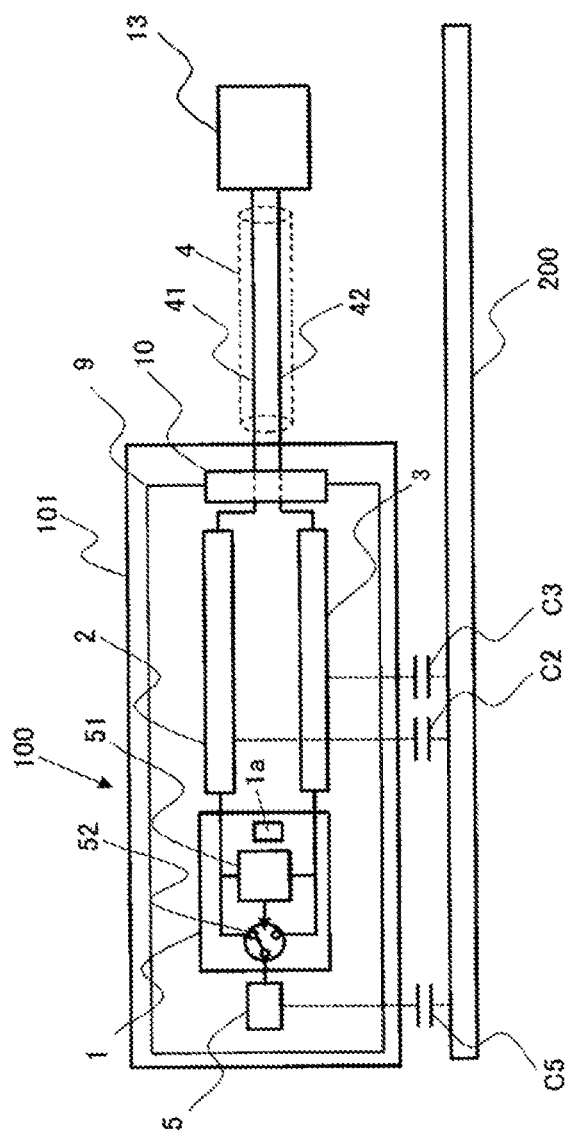
[FIG. 1]

[FIG. 2]
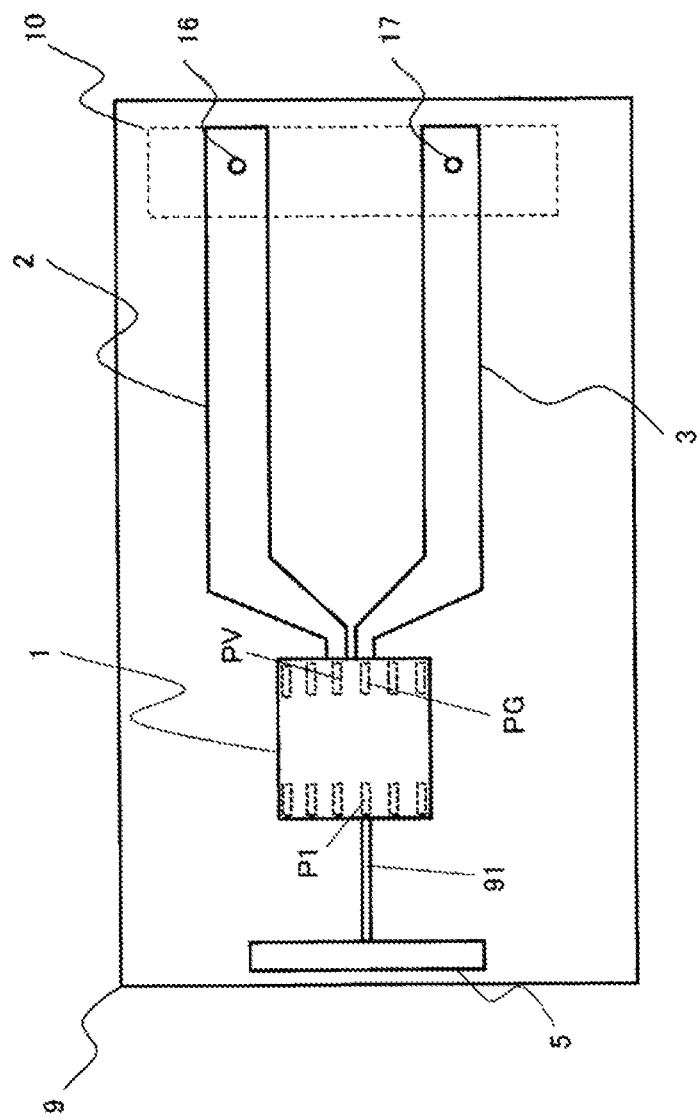

[FIG. 3]
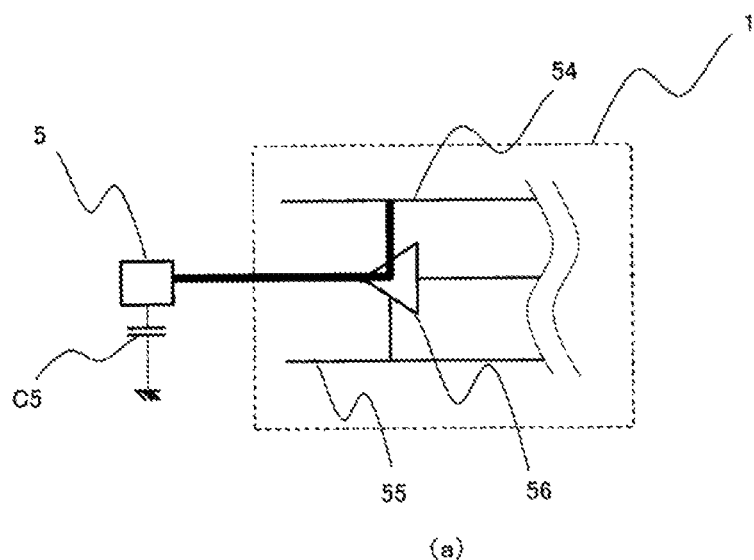
(a)
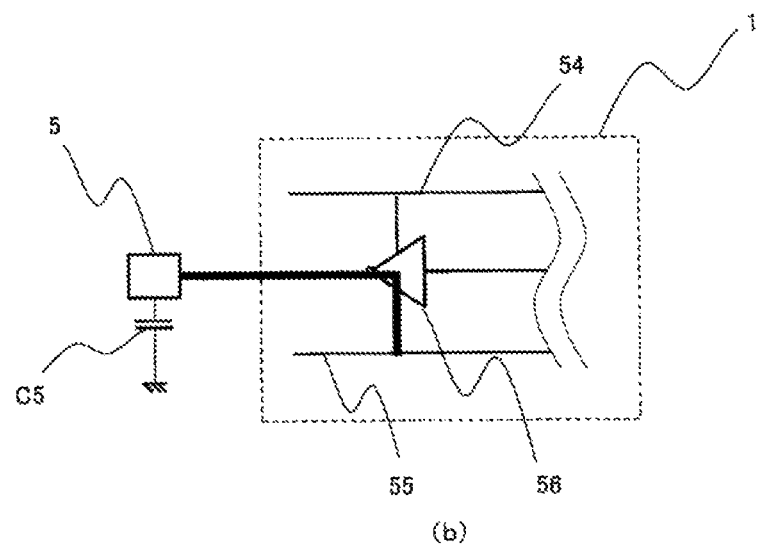
(b)

[FIG. 4]
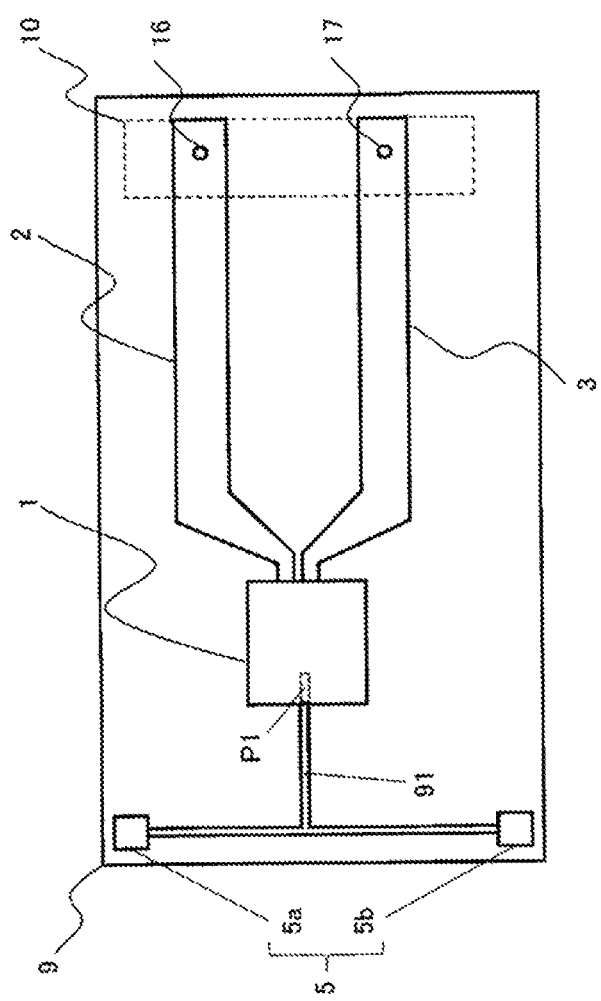

[FIG. 5]
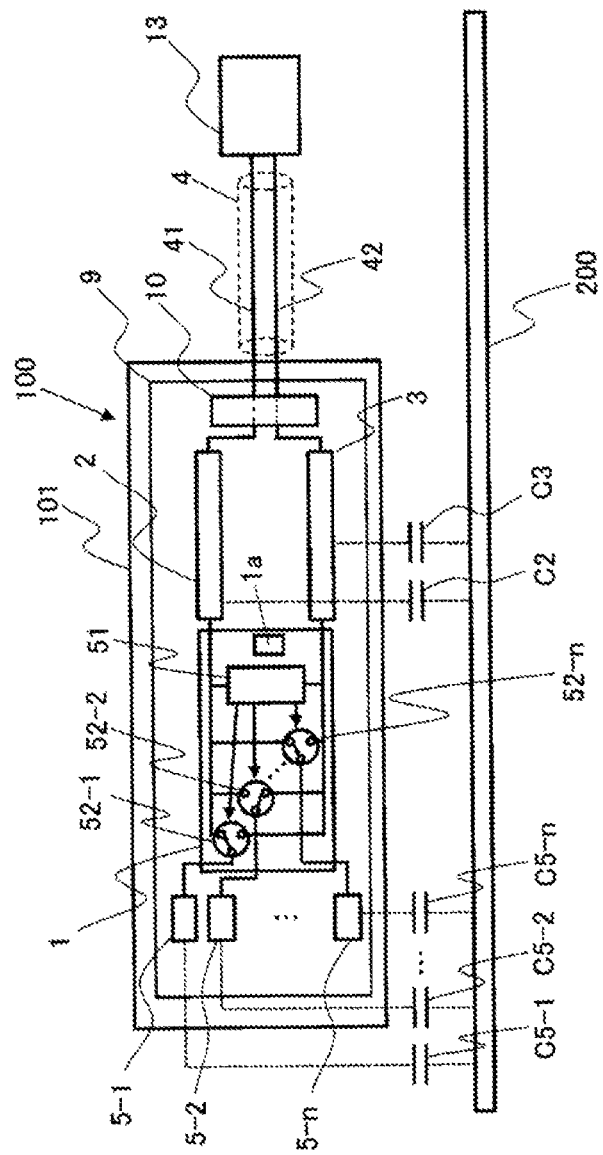

[FIG. 6]
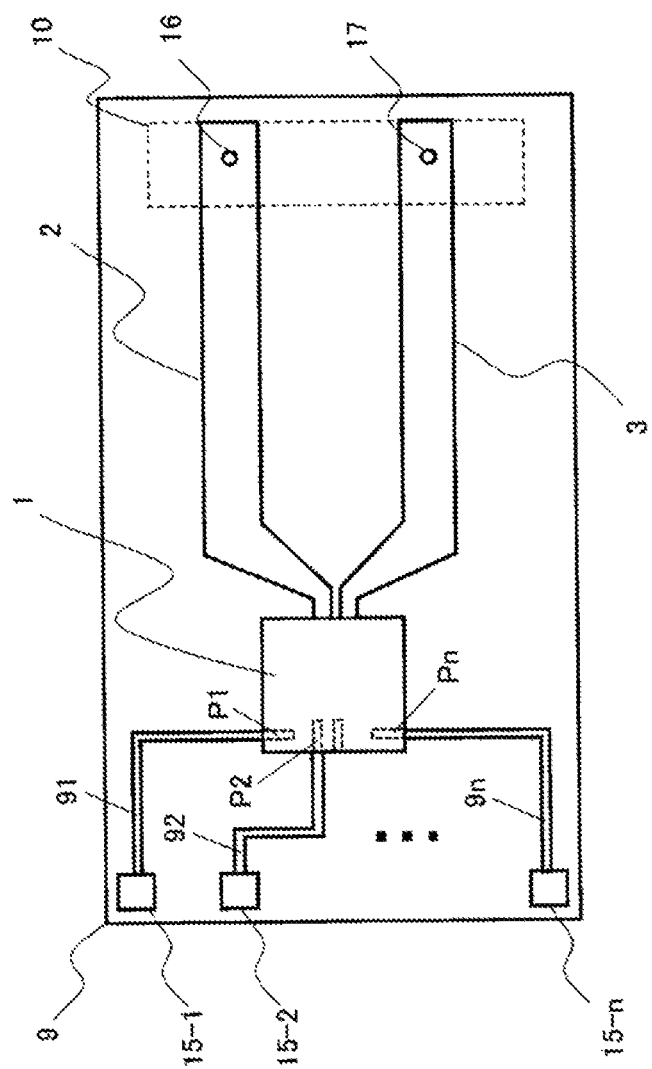

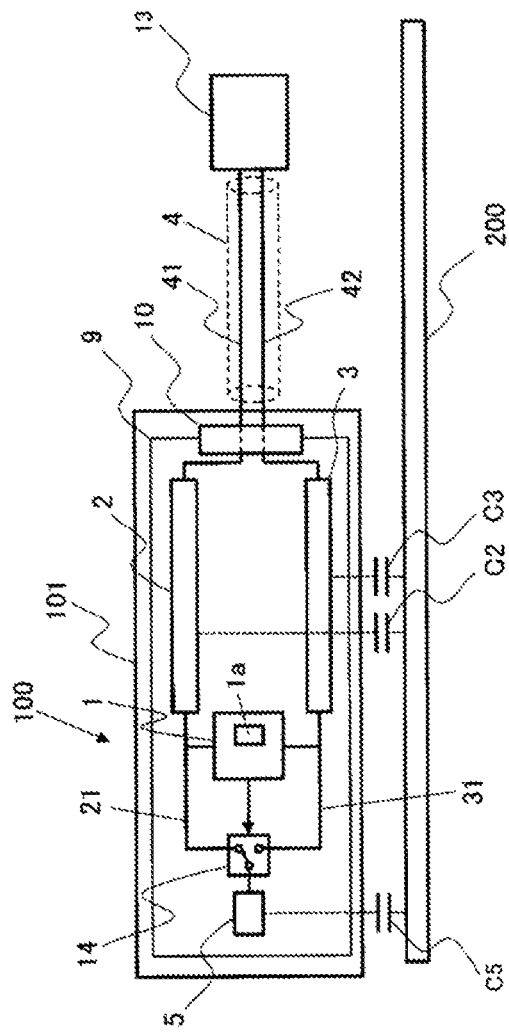
[FIG. 7]

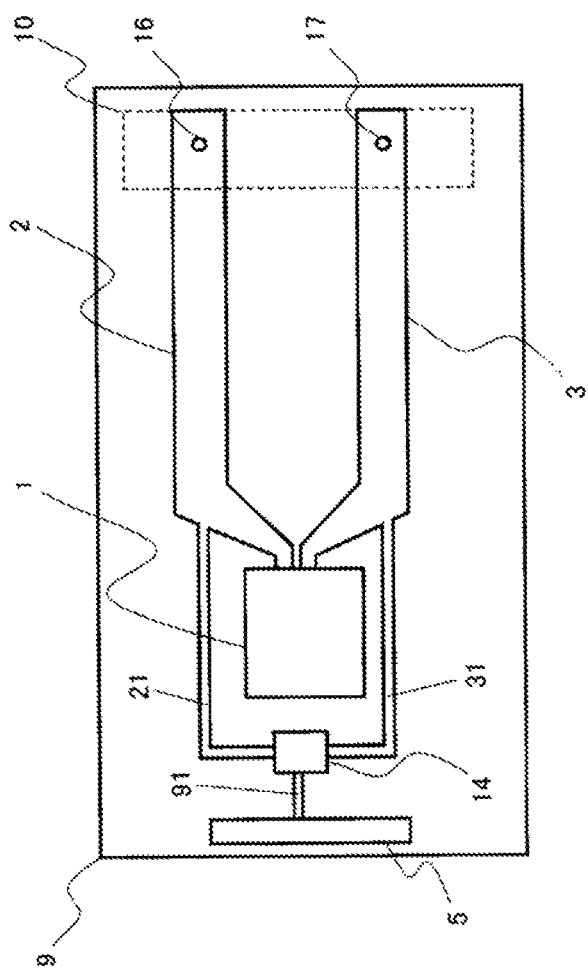
[FIG. 8]

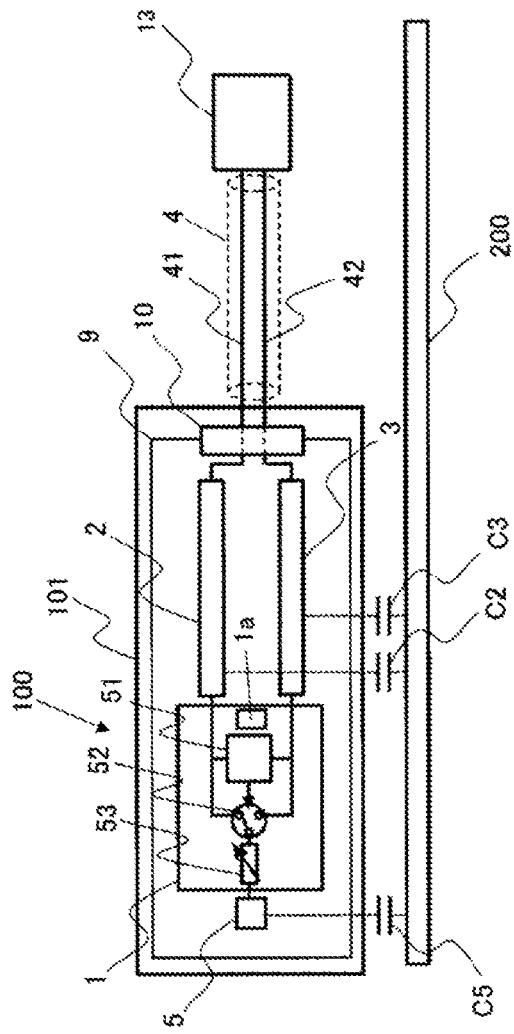
[FIG. 9]

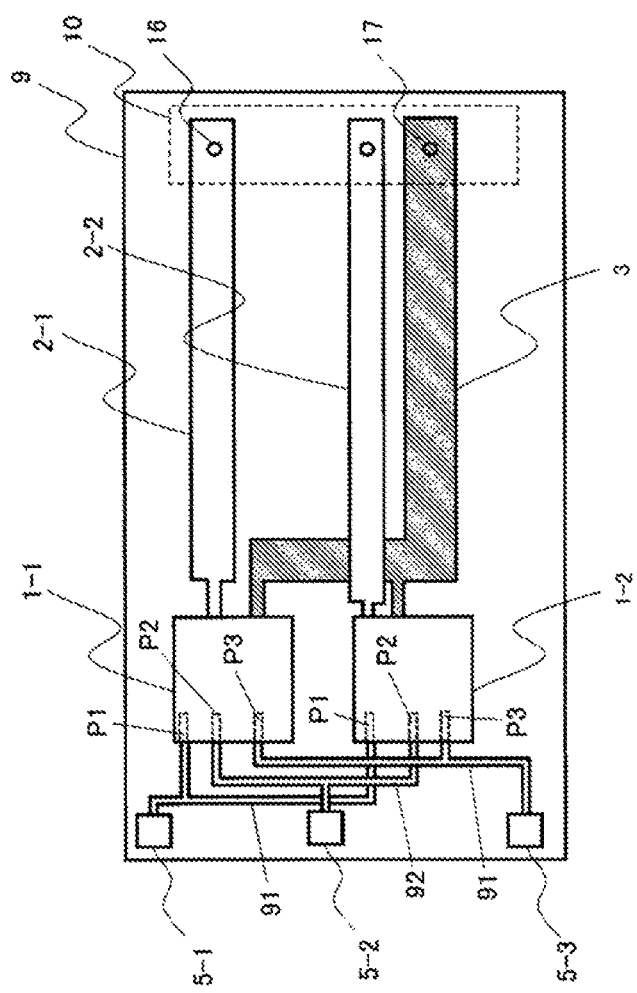
[FIG. 10]

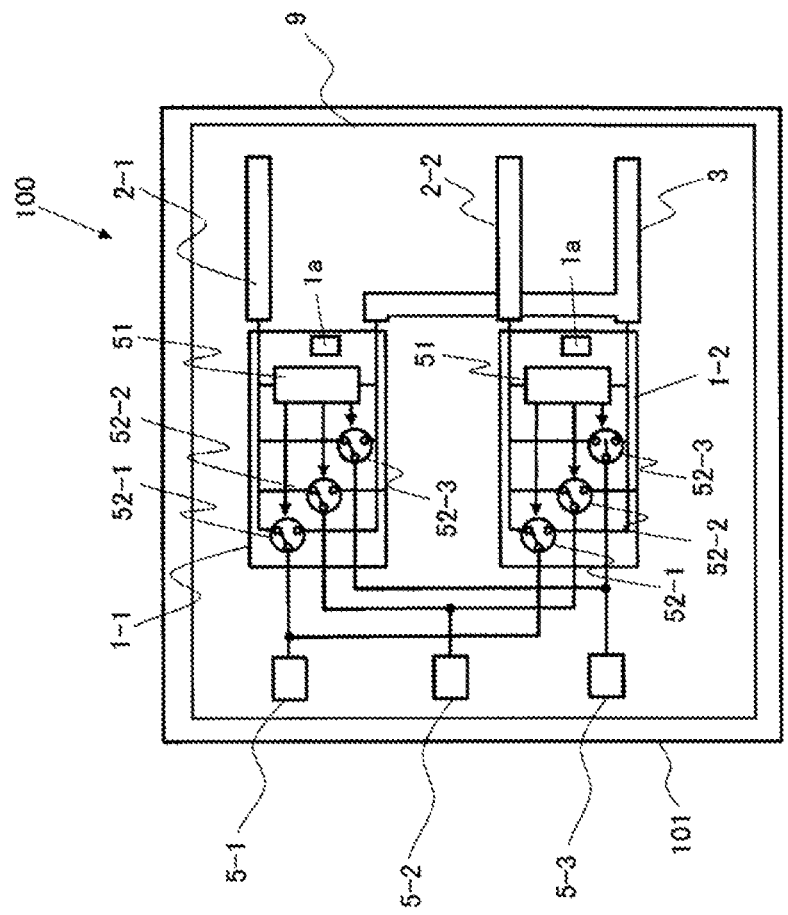
[FIG. 11]

[FIG. 12]
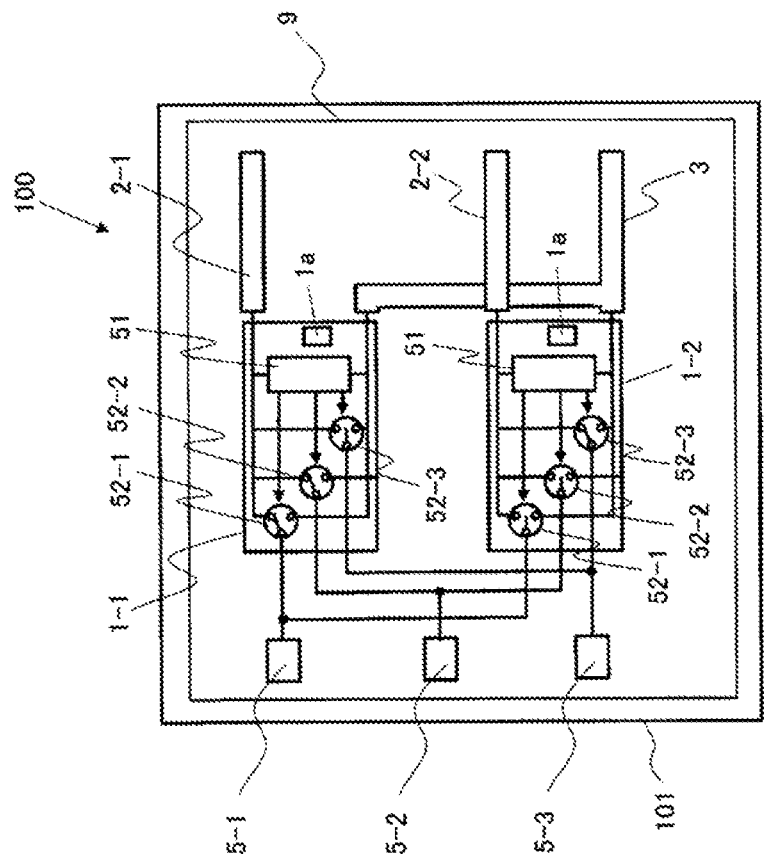

[FIG. 13]
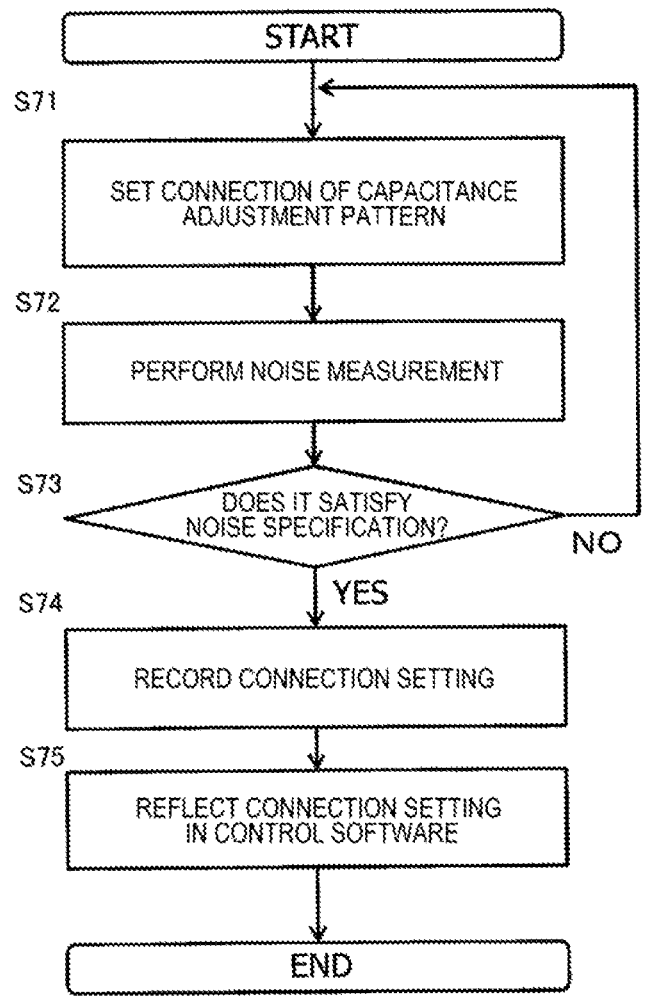

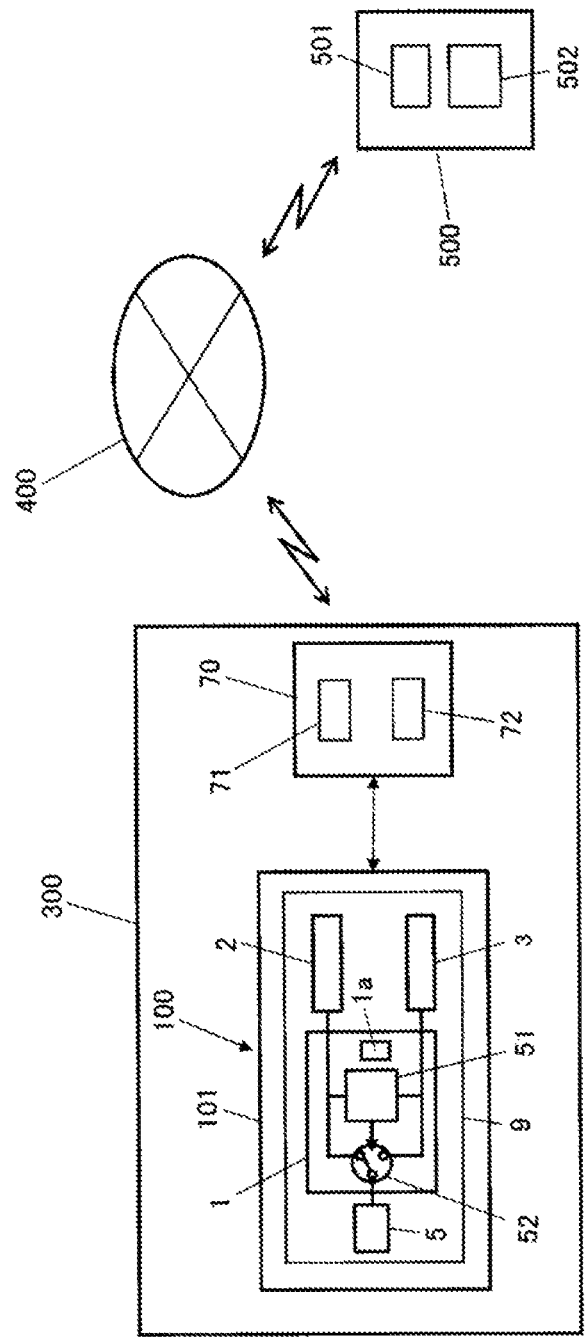
[FIG. 14]

[FIG. 15]
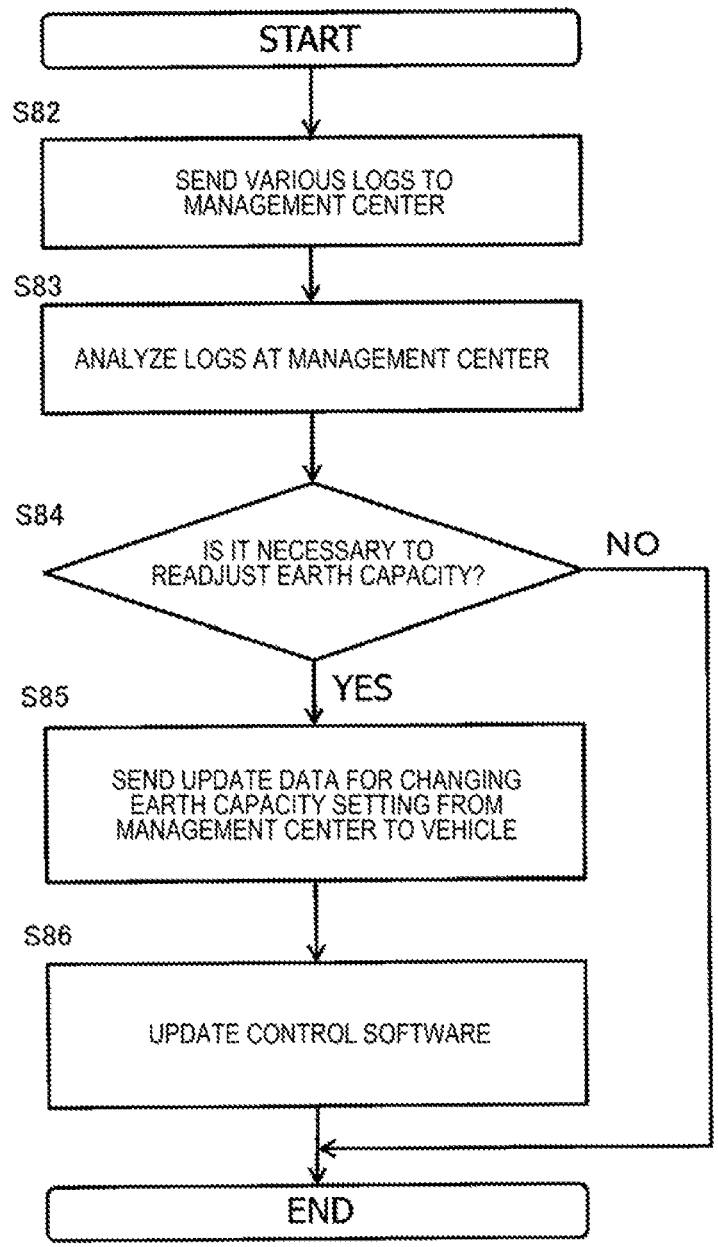

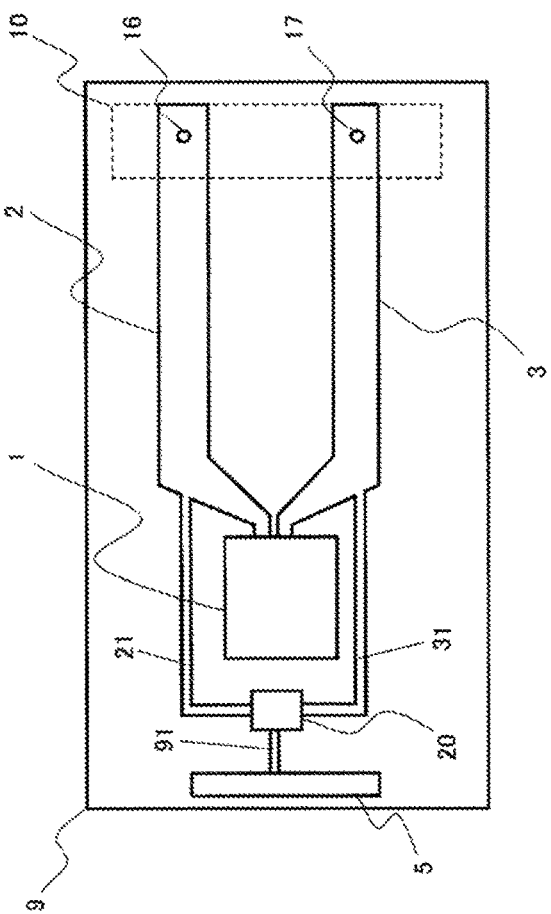
[FIG. 16]

[FIG. 17]
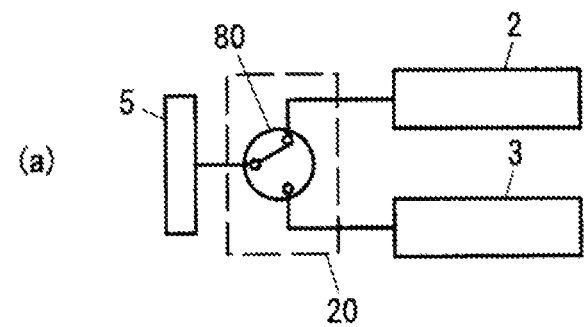
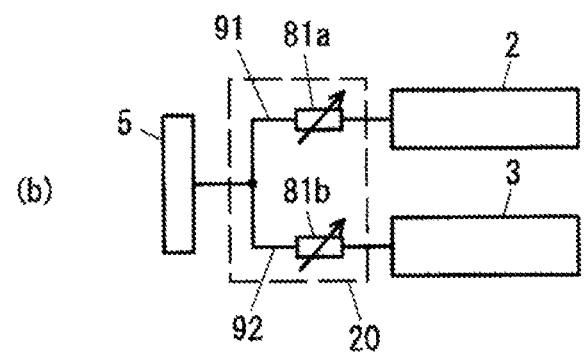
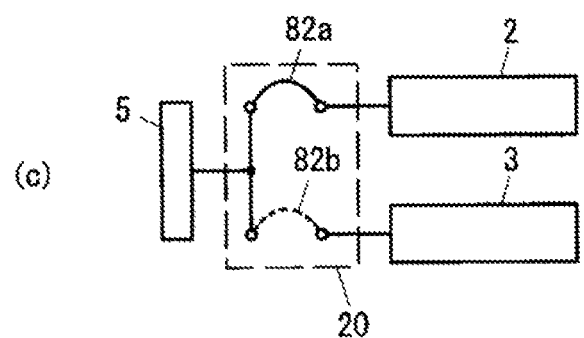

ELECTRONIC CONTROL DEVICE, VEHICLE, AND METHOD FOR MANUFACTURING ELECTRONIC CONTROL DEVICE

TECHNICAL FIELD

The present invention relates to an electronic control unit, a vehicle equipped with the electronic control unit, and an electronic control unit manufacturing method.

BACKGROUND ART

In an electronic control unit including a printed wiring board on which a semiconductor element is mounted, a common mode current which is an operating current of the semiconductor element flowing in the same phase with respect to a power supply and a ground leads to unnecessary electromagnetic radiation and failure of other elements, and thus it is necessary to prevent the current from spreading far from the vicinity of the semiconductor element. In particular, it is necessary to prevent the common mode current from being transmitted to cables, harnesses, or the likes which are easy to radiate unnecessary electromagnetic waves as antennas. PTL 1 discloses a configuration for adjusting impedance by adding adjustment elements to a power supply pattern and a ground pattern to control generation of a common mode current.

CITATION LIST

Patent Literature

PTL 1: JP-A-2010-073792

SUMMARY OF INVENTION

Technical Problem

However, an element constituting impedance of a power source pattern and a ground pattern to be adjusted includes an earth capacity which is a parasitic capacitance of a power supply pattern and the ground pattern in a printed circuit board with respect to a grounding surface. The earth capacity varies depending on a positional relationship between a printed circuit board and the grounding surface. Therefore, even if impedance of the printed circuit board is adjusted so as to reduce a common mode current in one installation environment, when it is used in another different installation environment, a common mode is not necessarily reduced, and thus problems such as unnecessary electromagnetic waves may occur.

For example, when an electronic control unit is installed in an automobile, in order to reduce the cost, there are increasing number of cases using resin instead of metal for a casing of the electronic control unit. Therefore, the printed circuit board and a chassis of the automobile which is a grounding surface have parasitic capacitance directly without passing through the casing. As a result, an influence of the power source and ground impedance on earth capacity according to the installation environment of the electronic control unit increases. Therefore, with the configuration disclosed in PTL 1 described above, it is necessary to change the design according to installation condition of a type of a vehicle equipped therewith and to change parts equipped on a printed wiring board in order to reduce the common mode current and this leads to an increase in a development period and cost.

Solution to Problem

According to a first aspect of the invention, there is provided an electronic control unit, which includes a printed wiring board on which a semiconductor element is mounted, including a power supply pattern and a ground pattern which are formed on the printed wiring board and connected to the semiconductor element, at least one capacitance adjustment pattern which is formed on the printed wiring board, and a connection portion which is provided for each capacitance adjustment pattern and able to switch electrical connection between either the power supply pattern or the ground pattern and the capacitance adjustment pattern.

According to a second aspect of the invention, there is provided a vehicle which includes the electronic control unit, a transmission unit which transmits information on a state of the vehicle, and a reception unit which receives update data which is determined based on the state of the vehicle and used for updating the control software, in which the control software is updated with the update data received by the reception unit.

According to a third aspect of the invention, there is provided an electronic control unit manufacturing method which includes performing processing for performing common-mode noise measurement by setting the power supply pattern, the ground pattern, and the capacitance adjustment pattern to an arbitrary connection state in relation to a plurality of connection states, selecting a connection state at which a result of the common-mode noise measurement in relation to the plurality of connection states is within a predetermined reference range, and installing the control software for controlling the connection state between the power supply pattern, the ground pattern, and the capacitance adjustment pattern to the selected connection state on the electronic control unit.

Advantageous Effects of Invention

According to the invention, earth capacity can be easily changed according to an installation environment of an electronic control unit and a common mode current can be reduced at low cost in a short period of time.

BRIEF DESCRIPTION OF DRAWINGS

FIG. 1 is a block diagram illustrating a basic configuration of an electronic control unit.

FIG. 2 is a plan view of a printed wiring board on which a semiconductor element is mounted.

FIG. 3 includes views for explaining connection using a signal driver.

FIG. 4 is a view for explaining a modification example of a first embodiment.

FIG. 5 is a block diagram of an electronic control unit according to a second embodiment.

FIG. 6 is a view illustrating a printed wiring board of the electronic control unit illustrated in FIG. 5.

FIG. 7 is a block diagram of an electronic control unit according to a third embodiment.

FIG. 8 is a view illustrating a printed wiring board of the electronic control unit illustrated in FIG. 7.

FIG. 9 is a view for explaining a fourth embodiment.

FIG. 10 is a view for explaining a fifth embodiment and illustrates a plan view of a printed wiring board.

FIG. 11 is a block diagram in a case where one power supply is provided.

FIG. 12 is a block diagram of a case where two power supplies are provided.

FIG. 13 is a view for explaining a sixth embodiment and is a flowchart illustrating an example of a setting method of control software.

FIG. 14 is a block diagram for explaining a seventh embodiment.

FIG. 15 is a diagram illustrating an example of adjustment flow.

FIG. 16 is a view for explaining an eighth embodiment and illustrates a plan view of a printed wiring board.

FIG. 17 includes diagrams illustrating specific examples of a switching component.

DESCRIPTION OF EMBODIMENTS

Hereinafter, modes for carrying out the invention will be described with reference to the drawings. In embodiments to be described below, a case where it is applied to an electronic control unit (ECU) installed in a vehicle such as an automobile will be described as an example.

First Embodiment

FIG. 1 is a block diagram illustrating a basic configuration of an electronic control unit 100. In FIG. 1, a configuration related to the features of the invention is mainly described and other elements, patterns, and the likes, may be added. A printed wiring board 9 on which a semiconductor element 1 (for example, a microcomputer) is mounted is accommodated in a casing 101 of the electronic control unit 100.

The printed wiring board 9 is connected to a battery 13 by a connector 10 and a harness 4 and DC power is supplied from the battery 13 to the electronic control unit 100. A power supply line 41 in the harness 4 is connected to a power supply pattern 2 formed on the printed wiring board 9 and a ground line 42 is connected to a ground pattern 3 formed on the printed wiring board 9. The semiconductor element 1 is powered by the power supply pattern 2 and the ground pattern 3.

A grounding surface 200 is provided in the vicinity of the electronic control unit 100. The grounding surface 200 is, for example, a chassis of a vehicle. The casing 101 is a resin casing and the power supply pattern 2 and the ground pattern 3 formed on the printed wiring board 9 respectively have earth capacities C2 and C3 which are parasitic capacitances with respect to the grounding surface 200.

As described above, the difference (unbalance) between currents flowing through the power supply line 41 and the ground line 42 of harness 4 is called a common mode current and becomes a factor of deterioration of the conduction EMI transmitted to the harness 4 and the electromagnetic radiation from the harness 4. The unbalance described above is caused by a current leaked from the electronic control unit 100 to the grounding surface 200 via the earth capacities C2 and C3.

In the related art, in a design stage of the electronic control unit 100, noise reduction is achieved by setting so that the earth capacities of the power supply line 41 and the ground line 42 are balanced. However, when the installation environment of the electronic control unit 100 is different from what is assumed at the design stage, the relationship of the earth capacities between the power supply line 41 and the ground line 42 and the grounding surface 200 changes, and thus the common mode current may increase. In particular, when a resin casing is used for the casing of the electronic control unit, the unbalance of the earth capacities becomes remarkable.

In the earth capacities C2 and C3 of the power supply pattern 2 and the ground pattern 3, capacitance values vary according to the installation environment of the electronic control unit 100, that is, the installation environment of the printed wiring board 9. Therefore, in the embodiment, a capacitance adjustment pattern 5 for adjusting the earth capacities of the power supply pattern 2 and the ground pattern 3 is arranged on the printed wiring board 9. The capacitance adjustment pattern 5 has an earth capacity C5 with respect to the grounding surface 200.

FIG. 2 is a plan view of the printed wiring board 9 on which the semiconductor element 1 is mounted. In FIG. 2, only printed wiring board patterns and parts related to the features of the invention are illustrated and other parts and patterns may be added. A right end of the power supply pattern 2 is connected to a power supply pin 16 of the connector 10 and a left end is connected to a power supply pin PV of the semiconductor element 1. A right end of the ground pattern 3 is connected to a ground pin 17 of the connector 10 and a left end is connected to a ground pin PG of the semiconductor element 1. Further, the capacitance adjustment pattern 5 formed along a left end side of the printed wiring board 9 is connected to a signal pin P1 of the semiconductor element 1 by wiring 91.

As illustrated in FIG. 1, the capacitance adjustment pattern 5 is connected to a connection switching circuit 52 in the semiconductor element 1. Setting of the connection switching circuit 52, that is, setting of whether the capacitance adjustment pattern 5 is connected to the power supply pattern 2 or the ground pattern 3 is performed by a circuit block 51 in the semiconductor element 1 based on control software. When the semiconductor element 1 is activated, switching is performed by the connection switching circuit 52, and thus the capacitance adjustment pattern 5 is connected to either the power supply pattern 2 or the ground pattern 3 and the connection state thereof is maintained. A storage portion 1a for storing the control software may be provided in the semiconductor element 1 or may be provided externally. As the connection switching circuit 52, it is possible to use a signal driver in the semiconductor element 1.

FIG. 3 illustrates circuit diagram images when the power supply pattern 2 or ground pattern 3 and the capacitance adjustment pattern 5 are connected using a signal driver 56 of the semiconductor element 1. As illustrated in FIG. 3(a), by fixing the output of the signal driver 56 at high, a power supply line 54 in the chip and the capacitance adjustment pattern 5 become conductive, and thus the capacitance adjustment pattern 5 and the power supply pattern 2 are electrically connected. As a result, it is possible to obtain the effect of adding the earth capacity C5 to the power supply pattern 2.

On the contrary, when the output of the signal driver 56 is fixed at low, as illustrated in FIG. 3(b), conduction between a ground line 55 in the semiconductor element 1 and the capacitance adjustment pattern 5 is achieved, and thus the capacitance adjustment pattern 5 and the ground pattern 3 are electrically connected. As a result, the earth capacity C5 is added to the ground pattern 3. Although not specifically illustrated here, a voltage regulator or the like in the semiconductor element 1 may be inserted between the power supply line 54 in the semiconductor element 1 and the power supply line (power supply pattern 2) of the printed wiring board 9.

As described above, in the embodiment, the capacitance adjustment pattern 5 is formed on the printed wiring board 9 and connected to the signal pin P1 of the semiconductor element 1 and the potential of the signal pin P1 is switched to either the high potential where the capacitance adjustment pattern 5 is electrically connected to the power supply pattern 2 or the low potential where the capacitance adjustment pattern 5 is electrically connected to the ground pattern 3 by the signal driver 56 provided in the semiconductor element 1. In this manner, the signal pin P1 and the signal driver 56 function as a connecting unit capable of switching the electrical connection between either the power supply pattern 2 or the ground pattern 3 and the capacitance adjustment pattern 5.

With such a switchable configuration, the earth capacities of the power supply pattern 2 and the ground pattern 3 can be easily adjusted according to the installation state of the electronic control unit 100 and the common mode current can be reduced regardless of the installation state. Even when an optimum earth capacity cannot be realized due to the addition of capacitance, the common mode current can be reduced by making the capacitance close to the optimum capacitance as described in PTL 1.

Furthermore, the setting of the switching state (connection state) of the signal driver 56 controlled by the circuit block 51 can be easily changed only by changing the control software stored in the storage portion 1a and does not require addition of parts or the like. When the control software is executed, the electrical connection between either the power supply pattern 2 or the ground pattern 3 and the capacitance adjustment pattern 5 is maintained in a predetermined connection state.

When a large potential fluctuation is applied to the capacitance adjustment pattern 5, the possibility of becoming a factor of radiation noise increases, and thus it is preferable that a pin far from other signal pins or the like be used as the signal pin P1 used for connection with the capacitance adjustment pattern 5 so that the potential fluctuation becomes as small as possible.

Modification Example

FIG. 4 is a view for explaining a modification example of a first embodiment described above and illustrates a plan view of the printed wiring board 9. In FIG. 4, only patterns and parts related to the features of the modification example are illustrated and other patterns and parts may be mounted. The capacitance adjustment pattern 5 formed on the printed wiring board 9 has two branch patterns 5a and 5b branched by the wiring 91. The branch patterns 5a and 5b are connected to the same signal pin P1 of the semiconductor element 1 by the wiring 91. The branch patterns 5a and 5b are arranged close to different sides of the printed wiring board 9. In the example illustrated in FIG. 4, the branch pattern 5a is arranged in the vicinity of an upper side of the printed wiring board 9 in the drawing and the branch pattern 5b is arranged in the vicinity of a lower side of the printed wiring board 9 in the drawing.

In this way, the two branch patterns 5a and 5b of the capacitance adjustment pattern 5 are arranged close to different sides on the printed wiring board 9, in such a manner that, even when the grounding surface 200 (see FIG. 1) approaches either side, the capacitance adjustment pattern 5 can have a large earth capacity as a whole. As a result, the area of a pattern surface to be secured as the capacitance adjustment pattern 5 can be further reduced and the size of the printed wiring board 9 and the unit can be reduced.

In the example illustrated in FIG. 4, the capacitance adjustment pattern 5 is constituted of two branch patterns 5a and 5b. However, it may be constituted of three or more branch patterns and the branch patterns may be arranged in different regions of the printed wiring board 9.

Second Embodiment

FIGS. 5 and 6 are views for explaining a second embodiment. FIG. 5 is a block diagram of an electronic control unit 100 according to the second embodiment. FIG. 6 is a plan view of the printed wiring board 9. FIGS. 5 and 6 illustrates only the elements, parts, and patterns related to the features of the embodiment and other elements, parts, and patterns may be added.

In the embodiment, a plurality (n) of capacitance adjustment patterns 5-1 to 5-n are formed on the printed wiring board 9. As illustrated in FIG. 6, the capacitance adjustment patterns 5-1 to 5-n are respectively connected to different signal pins P1 to Pn of the semiconductor element 1 by wiring 91 to 9n. Respective signal pin P1 to Pn are individually connected to connection switching circuits 52-1 to 52-n in the semiconductor element 1. Therefore, the connection switching circuits 52-1 to 52-n can individually switch connection with the power supply pattern 2 or the ground pattern 3. Signal drives provided in the semiconductor element 1 are used as the connection switching circuits 52-1 to 52-n.

With such a configuration, the connection state of the connection switching circuits 52-1 to 52-n is changed, in such a manner that the number and position of the capacitance adjustment patterns connected to the power supply pattern 2 or the ground pattern 3 can be finely adjusted. As a result, it becomes possible to adjust the earth capacity on the power supply pattern 2 side and the earth capacity on the ground pattern 3 side to the optimum earth capacity for reducing the common mode current.

Also, in this embodiment, as in the case of the first embodiment, the switching state of the connection switching circuit 52 is set by the circuit block 51 in the semiconductor element 1 based on the control software stored in the storage portion 1a.

Third Embodiment

FIGS. 7 and 8 are views for explaining a third embodiment. FIG. 7 is a block diagram of an electronic control unit 100 according to the third embodiment. FIG. 8 is a plan view of the printed wiring board 9. In this embodiment, apart from the semiconductor element 1, the connection switching element 14 for switching the connection between the capacitance adjustment pattern 5 and the power supply pattern 2 or the ground pattern 3 is provided on the printed wiring board 9. The connection switching element 14 is connected to the capacitance adjustment pattern 5 and is also connected to the power supply pattern 2 and the ground pattern 3. As illustrated in FIG. 8, the connection switching element 14 is connected to the capacitance adjustment pattern 5 by the wiring 91, connected to the power supply pattern 2 by wiring 21, and connected to the ground pattern 3 by wiring 31.

The connection switching element 14 changes the connection destination of the capacitance adjustment pattern 5 to the power supply pattern 2 or the ground pattern 3 according to a command signal from the semiconductor element 1. Control software for generating the command signal is stored in the storage portion 1a. According to the control software, either the power supply pattern 2 or the ground pattern 3 and the capacitance adjustment pattern 5 are connected and the connection state is maintained. An analog multiplexer, two analog switches, relays, and the likes can be used as the connection switching element 14.

In the configuration of the embodiment, since the connection switching element 14 is provided separately from the semiconductor element 1, even when semiconductor element 1 has no signal pin vacancy, it is possible to connect the capacitance adjustment pattern 5 to the power supply pattern 2 or the ground pattern 3 in a switching manner according to the installation environment of the electronic control unit 100. As a result, an increase in common mode noise due to a change in the installation environment can be reduced.

In the example illustrated in FIGS. 7 and 8, only one capacitance adjustment pattern 5 is provided on the printed wiring board 9. However, two or more capacitance adjustment patterns 5 may be provided. In that case, the connection switching element 14 is provided for each capacitance adjustment pattern 5.

Fourth Embodiment

FIG. 9 is a view for explaining a fourth embodiment and illustrates a block diagram of the electronic control unit 100. In the embodiment, a variable resistor 53 is connected to the connection switching circuit 52 in the semiconductor element 1. Therefore, the current flowing from the power supply pattern 2 or the ground pattern 3 to the ground via the earth capacity C5 of the capacitance adjustment pattern 5 is controlled by the resistance value of the variable resistor 53. That is, the same effect as changing the earth capacity C5 of the capacitance adjustment pattern 5 can be obtained substantially.

As a result, without dividing the capacitance adjustment pattern into a plurality of patterns and controlling the connection relationship between the capacitance adjustment pattern and the power supply pattern 2 or the ground pattern 3 using individual signal pins for each pattern, as in the configuration illustrated in FIGS. 5 and 6 of the second embodiment, it is possible to finely adjust the earth capacity. In the embodiment, it is possible to reduce the number of signal pins of the semiconductor element 1 used for adjusting the earth capacity, and thus the package size of the semiconductor element 1 is reduced and the printed wiring board size is reduced.

Further, a series circuit of the connection switching circuit 52 and the variable resistor 53 in the semiconductor element 1 can be realized by arranging resistance elements having different resistance values in parallel in the chip of the semiconductor element 1 as a dedicated circuit and switching the conduction by an MOS switch. Although the range of change in the resistance value is limited, it is also possible to use a signal driver capable of adjusting the output impedance.

Fifth Embodiment

A fifth embodiment will be described with reference to FIGS. 10 to 12. FIG. 10 is a plan view of the printed wiring board 9. FIG. 11 is a block diagram of the electronic control unit 100. The printed wiring board 9 has a plurality of conductor layers. In FIG. 10, all the conductor layers are illustrated in a superimposed state. In FIGS. 10 to 12, only patterns and parts illustrating the features of the embodiment are illustrated and other parts and patterns may be added.

In the embodiment, a plurality of semiconductor elements are mounted on a printed wiring board and a plurality of capacitance adjustment patterns are also arranged. In the example illustrated in FIG. 10, two semiconductor elements 1-1 and 1-2 are mounted on the printed wiring board 9 and three capacitance adjustment patterns 5-1, 5-2, and 5-3 are arranged. The capacitance adjustment pattern 5-1 is connected to the signal pins P1 of respective semiconductor elements 1-1 and 1-2 by the wiring 91. The capacitance adjustment pattern 5-2 is connected to the signal pins P2 of respective semiconductor elements 1-1 and 1-2 by wiring 92. The capacitance adjustment pattern 5-3 is connected to the signal pins P3 of respective semiconductor elements 1-1 and 1-2 by wiring 93.

The semiconductor element 1-1 is powered by the power supply pattern 2-1 and the ground pattern 3. The semiconductor element 1-2 is powered by the power supply pattern 2-2 and the ground pattern 3. The power supply patterns 2-1 and 2-2 are at the same potential and DC power of the same voltage is supplied to the semiconductor elements 1-1 and 1-2. In the example, the ground pattern 3 is shared by the semiconductor elements 1-1 and 1-2, but the semiconductor elements may be powered with separate patterns without sharing. Also, the power supply pattern may not be divided like the power supply patterns 2-1 and 2-2 and the semiconductor elements may be powered with a shared power supply pattern.

As illustrated in FIG. 11, connection switching circuits 52-1, 52-2, and 52-3 are individually provided in the signal pins P1, P2, and P3 of the semiconductor elements 1-1 and 1-2. For example, signal drivers are used for the connection switching circuits 52-1, 52-2, and 52-3. In this case, a tri-state buffer is used for the signal driver. That is, the connection switching circuits 52-1, 52-2, and 52-3 can take a state of being connected to the power supply pattern 2-1, a state of being connected to the ground pattern 3, and a state of being connected to neither. In the example shown in FIG. 11, three capacitance adjustment patterns 5-1 to 5-3 are connected to the power supply pattern 2-1, and two capacitance adjustment patterns 5-1 and 5-2 are connected to the power supply pattern 2-2, and further none of the capacitance adjustment patterns are connected to the ground pattern 3. The connection switching circuit 52-3 of the semiconductor element 1-2 is connected to neither the power supply pattern 2-2 nor the ground pattern 3.

In a case where a plurality of semiconductor elements are mounted as illustrated in FIGS. 10 and 11, it is preferable to individually adjust the capacitance. Furthermore, in order to finely adjust the capacitance for reducing the common mode, it is preferable to prepare a plurality of capacitance adjustment patterns as illustrated in FIGS. 6 and 7 and adjust the capacitance to the optimum earth capacity by selecting a pattern from various combinations. However, there is a disadvantage that, when a plurality of capacitance adjustment patterns are prepared for each of a plurality of semiconductor elements, the printed wiring board space becomes large.

In the example illustrated in FIG. 11, a case where one power supply is provided and the potentials of the power supply patterns 2-1 and 2-2 are the same is illustrated. On the other hand, when the potentials of the power supply patterns 2-1 and 2-2 are different, such as V1 and V2, that is, when two power supplies are provided, the connection switching circuits 52-1, 52-2, 52-3 are controlled so that the capacitance adjustment pattern connected to the power supply pattern 2-1 and the capacitance adjustment pattern connected to the power supply pattern 2-2 are different from each other. For example, the connection states of the connection switching circuits 52-1, 52-2 and 52-3 are set as illustrated in FIG. 12. In the example illustrated in FIG. 12, the capacitance adjustment patterns 5-1 and 5-2 are connected to the power supply pattern 2-1 and the capacitance adjustment pattern 5-3 is connected to the power supply pattern 2-2. The connection switching circuit 52-3 of the semiconductor element 1-1 and the connection switching circuits 52-1 and 52-2 of the semiconductor element 1-2 are not connected to any of the power supply patterns 2-1 and 2-2 and the ground pattern 3.

Sixth Embodiment

FIG. 13 is a view for explaining s sixth embodiment. In the first to fifth embodiments described above, when the semiconductor element 1 is activated, the switching state of the connection switching circuit is controlled by the control software stored in the storage portion 1a so that the capacitance adjustment pattern is connected to the power supply pattern or the ground pattern. In the sixth embodiment, a setting method of control software will be described. FIG. 13 is a flowchart illustrating an example of the setting method of control software. In the following description, an electronic control unit mounted on a vehicle (for example, an automobile) will be described as an example.

When the type of vehicle equipped with the electronic control unit 100 is different, the installation environment of the electronic control unit 100 is different. Therefore, adjustment of the earth capacity is performed under the condition where the electronic control unit 100 is incorporated for each type of vehicle. That is, the processing according to the flow of FIG. 13 is performed for each type of vehicle and the control software is created. In Step S71 of FIG. 13, the connection between the capacitance adjustment pattern 5, the power supply pattern 2, and the ground pattern 3 is set using adjustment software instead of the control software described above. The adjustment software is software which can change the connection setting and, in this case, initial setting of the connection setting is performed in consideration of the installation condition in a vehicle to be tested.

In Step S72, noise measurement is performed under the condition where the electronic control unit 100 is incorporated in the vehicle according to the connection setting set in Step S71. In Step S73, it is determined whether the measured noise clears the noise specification to be satisfied. When it is determined in Step S73 that the noise specification is not satisfied, the process returns to Step S71 and the connection setting of the capacitance adjustment pattern is reset with reference to the noise measurement result. That is, the connection setting is changed. Then, the noise measurement in Step S72 is performed again. Next, in Step S73, it is determined whether the measurement result satisfies the noise specification. In this manner, by repeatedly performing the processing from Step S71 to step S73, the earth capacity is optimized and the connection setting satisfying the noise specification is searched.

When the noise measurement result satisfies the noise specification in Step S73, the connection setting (the earth capacity adjustment result) in this case is recorded in Step S74. In Step S75, a product version of the control software reflecting the connection setting recorded in Step S74 is created. This control software is installed in the electronic control unit 100.

As described above, in the embodiment, the power supply pattern 2, the ground pattern 3, and the capacitance adjustment pattern 5 are set to an arbitrary connection state (Step S71) and the processing of performing the common-mode noise measurement (Step S72) is performed in relation to a plurality of connection states, and then a connection state in which the result of the common-mode noise measurement in relation to the plurality of connection states is within a predetermined reference range is selected (Step S73). Next, control software for controlling the connection state between the power supply pattern 2, the ground pattern 3, and the capacitance adjustment pattern 5 to the selected connection state is installed on the electronic control unit 100 (Step S75).

As described above, since the electronic control unit 100 is configured such that the electrical connection between either the power supply pattern 2 or the ground pattern 3 and the capacitance adjustment pattern 5 can be switched, it is possible to optimally adjust the earth capacity for various installation situations by setting the control software by the processing illustrated in the flow of FIG. 13. Further, since the setting of earth capacity adjustment determined by the flow of FIG. 13 is reflected in the control software at the time of shipment, it is possible to avoid an increase in the common mode current due to the difference in mounting environment of the electronic control unit depending on the type of vehicle without redesigning or remodeling the printed wiring board in particular.

Seventh Embodiment

A seventh embodiment will be described with reference to FIGS. 14 and 15. In the sixth embodiment described above, the adjustment and the optimization of the earth capacity is achieved by storing the control software in the storage portion 1a of the electronic control unit 100 and setting the connection state of the connection switching circuits 52-1, 52-2, and 52-3 based on the control software.

However, when there is a change in software, a function addition, a change in the hardware configuration, or the like for the purpose of eliminating a failure or adding a function on the electronic control unit 100 or the vehicle side after the control software is set, the spectrum of the operating current of the semiconductor element 1 in the electronic control unit 100 may change or the peripheral module of the electronic control unit 100 may change. In such a case, the common mode current from the electronic control unit 100 may not satisfy the noise specification or the noise margin may decrease.

The embodiment is intended to deal with such a problem. A main configuration is illustrated in FIG. 14 and an example of an adjustment flow is illustrated in FIG. 15. As illustrated in FIG. 14, the electronic control unit 100 is mounted on a vehicle 300 such as an automobile. The vehicle 300 is provided with a communication device 70 for exchanging information with a management center 500 via an Internet communication network 400. The communication device 70 includes a transmission unit 71 and a reception unit 72. The configuration of the electronic control unit 100 is the same as that illustrated in FIG. 1.

When the situation becomes a situation where readjustment of the earth capacity is necessary due to a change in the configuration of hardware, software update, or the like, the flow illustrated in FIG. 15 is started with an event requiring readjustment as a starting point. Also, the flow of FIG. 15 may be executed at the time of starting a vehicle or periodically. In the following description, a case where the flow of FIG. 15 is started by starting a vehicle will be described as an example.

In Step S82 of FIG. 15, log data in which a software status of the vehicle 300, configuration information of the hardware, and the like are recorded is transmitted from the transmission unit 71 and transmitted to the management center 500 via the Internet communication network 400. On the management center 500 side, when the log data is received, a computing unit 501 analyzes the received log data (Step S83) and determines whether it is necessary to readjust the earth capacity of the electronic control unit 100 (Step S84).

Optimum earth capacity adjustment patterns corresponding to combinations of various hardware and software are derived by the noise measurement or the like and stored in a database 502 in advance. The computing unit 501 performs the determination of Step S84 by comparing with those data.

When readjustment is not necessary, the process is finished. Further, when it is determined in Step S84 that readjustment is necessary, the management center 500 transmits update data for updating the control software of the electronic control unit 100, that is, update data for changing the connection state of the connection switching circuits 52-1, 52-2, and 52-3 to the vehicle 300 (Step S85). On the vehicle 300 side, the control software of the electronic control unit 100 is updated based on the received update data using a software update function on the vehicle 300 side (Step S86). When the update of the control software is completed, the connection state of the connection switching circuits 52-1, 52-2, and 52-3 is changed, and thus the earth capacity is adjusted to the optimum state.

As described above, in the embodiment, the vehicle 300 includes the electronic control unit 100, the transmission unit 71 which transmits information on a state of a vehicle, and a reception unit 72 which receives update data which is determined based on the state of the vehicle and used for updating the control software. As described above, even when the common-mode noise increases due to a change in a state of a vehicle after the electronic control unit 100 adjusted to the optimum earth capacity is mounted on the vehicle 300, the control software is updated according to the change of the statue of the vehicle by receiving the update data by the reception unit 72 and the earth capacity is readjusted to the optimum state.

Further, in relation to the transmission of various logs, it is possible to conceive that the error rate of the radio and communication of the vehicle 300, the values of various sensors thereof, and the like may be included, and thus it is also possible to detect unnecessary electromagnetic radiation due to electrical characteristic changes accompanying aging deterioration, connection failure, or the like and adjust the earth capacity so as to correspond thereto.

Eighth Embodiment

An eighth embodiment of the invention will be described with reference to FIGS. 16 and 17. FIG. 16 is a plan view of the printed wiring board 9. In the embodiment, the connection switching element 14 illustrated in FIG. 8 of the third embodiment is replaced with a switching component 20 which can be switched manually. The other configuration is the same as that illustrates in FIG. 8. For the switching component 20, a component in which the connection setting of the capacitance adjustment pattern 5, the power supply pattern 2, and the ground pattern 3 can be simply and manually set in accordance with mounting or unmounting of a part, switching of a switch, or the like is used.

For example, as illustrated in FIG. 17(a), a changeover switch 80 which can be manually changed is provided as a switching part. As illustrated in FIG. 17(b), variable resistors 81a and 81b of a dial type may be respectively provided in the wiring 91 and 92 connecting the capacitance adjustment pattern 5, the power supply pattern 2, and the ground pattern 3. In this case, by setting the resistance of the variable resistor 81a to be large and the resistance of the variable resistor 81b to be small, it is substantially concluded that the capacitance adjustment pattern 5 and the ground pattern 3 are connected. In addition, as illustrated in FIG. 17(c), jumper wires 82a and 82b may be provided between the capacitance adjustment pattern 5, the power supply pattern 2, and the ground pattern 3. In the example illustrated in FIG. 17(c), the jumper line 82b indicated by the broken line is disconnected and the capacitance adjustment pattern 5 and the power supply pattern 2 are connected.

As described above, even when the switching component 20 which can be switched manually is used, the effect of the capacitance adjustment pattern 5 is adjusted and the earth capacity can be adjusted to the optimum earth capacity.

Although various embodiments and modification examples are described above, the invention is not limited to those contents. Other aspects considered within the technical idea of the invention are also included within the scope of the invention.

The disclosure content of the following priority application is incorporated herein as a quotation.

Japanese Patent Application No. 2016-120936 (filed Jun. 17, 2016)

REFERENCE SIGNS LIST 1, 1-1, 1-2: semiconductor element
1a: storage portion
2, 2-1, 2-2: power supply pattern
3: ground pattern
4: harness
5, 5-1 to 5-n: capacitance adjustment pattern
5a, 5b: branch pattern
9: printed wiring board
14: connection switching element
20: switching component
41: power supply line
42: ground line
51: circuit block
52, 52-1, 52-2, 52-3: connection switching circuit
53, 81a, 81b: variable resistor
56: signal driver
70: communication device
71: transmission unit
72: reception unit
80: changeover switch
82a, 82b: jumper wire
100: electronic control unit
101: casing
200: grounding surface
201, 202, 203: earth capacity
300: vehicle
P1, P2, P3: signal pin

The invention claimed is:
1. An electronic control unit which includes a printed wiring board on which a semiconductor element is mounted, comprising:

a power supply pattern and a ground pattern which are formed on the printed wiring board and connected to the semiconductor element;

at least one capacitance adjustment pattern which is formed on the printed wiring board;

a connection portion which is provided for each capacitance adjustment pattern and able to switch electrical connection between either the power supply pattern or the ground pattern and the capacitance adjustment pattern;

a control unit which controls the connection portion based on control software for setting a connection state;

wherein electrical connection between either the power supply pattern or the ground pattern and the capacitance adjustment pattern is maintained when the control software is executed by the control unit;

a variable resistor for changing electric resistance between the power supply pattern, the ground pattern, and the capacitance adjustment pattern; and wherein electric resistance of the variable resistor is controlled by the control unit.

2. The electronic control unit according to claim 1, wherein a plurality of the semiconductor elements are provided on the printed wiring board, and the capacitance adjustment pattern is connected to the signal pins of the plurality of semiconductor elements.

3. A vehicle comprising: the electronic control unit according to claim 1;

a transmission unit which transmits information on a state of the vehicle; and a reception unit which receives update data which is determined based on the state of the vehicle and used for updating the control software, wherein the control software is updated with the update data received by the reception unit.

4. The electronic control unit according to claim 1, wherein the connection portion is a switching part capable of being manually switched.

5. An electronic control unit manufacturing method of manufacturing the electronic control unit according to claim 1, comprising:

performing processing of common-mode noise measurement by setting the power supply pattern, the ground pattern, and the capacitance adjustment pattern to an arbitrary connection state in relation to a plurality of connection states;

selecting a connection state at which a result of the common-mode noise measurement in relation to the plurality of connection states is within a predetermined reference range; and installing the control software for controlling the connection state between the power supply pattern, the ground pattern, and the capacitance adjustment pattern to the selected connection state on the electronic control unit.

6. The electronic control unit according to claim 1, wherein the capacitance adjustment pattern has a branch pattern which branches into a plurality of branches and is arranged at different positions on the printed wiring board.

7. The electronic control unit according to claim 1, wherein the connection portion includes a signal pin of the semiconductor element which is connected to the capacitance adjustment pattern, and a signal driver which switches a potential of the signal pin to either a high potential at which the capacitance adjustment pattern is electrically connected to the power supply pattern or a low potential at which the capacitance adjustment pattern is electrically connected to the ground pattern, and the potential of the signal pin is maintained at either the low potential or the high potential by controlling the signal driver with the control unit.

8. The electronic control unit according to claim 1, wherein the connection portion is provided separately from the semiconductor element and is a connection switching element for selectively connecting the capacitance adjustment pattern to either the power supply pattern or the ground pattern, and either the power supply pattern or the ground pattern is connected to the capacitance adjustment pattern by controlling the connection switching element with the control unit.

\* \* \* \* \*